(12) United States Patent
Chapuis (10) Patent No.: US 7,057,379 B2
(45) Date of Patent: *Jun. 6, 2006

(54) SYSTEM AND METHOD FOR PROVIDING DIGITAL PULSE WIDTH MODULATION

(75) Inventor: Alain Chapuis, Morgan Hill, CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/187,182

(22) Filed: Jul. 21, 2005

(65) Prior Publication Data

US 2005/0270006 A1    Dec. 8, 2005

Related U.S. Application Data

(63) Continuation of application No. 10/986,607, filed on Nov. 11, 2004, which is a continuation of application No. 10/299,439, filed on Nov. 19, 2002, now Pat. No. 6,833,691.

(30) Foreign Application Priority Data

Jul. 23, 2004   (FR)   .................... 04 08186

(51) Int. Cl.
  *G05F 1/40* (2006.01)
(52) U.S. Cl. ........................... 323/283; 323/225
(58) Field of Classification Search ................ 323/222, 323/225, 263, 282, 283, 284, 290, 211; 327/149, 327/153, 159, 172, 175
See application file for complete search history.

(56) References Cited

U.S. PATENT DOCUMENTS

| | | | |
|---|---|---|---|
| 3,660,672 A | 5/1972 | Berger et al. | |
| 4,194,147 A | 3/1980 | Payne et al. | |

(Continued)

FOREIGN PATENT DOCUMENTS

EP    0660487    6/1995

(Continued)

OTHER PUBLICATIONS

33702 Microprocessor Power Supply (3.0A), Analog Products MC33702 Fact Sheet; Motorola/Digital dna/ Power Management Switching; pp. 1-4.

(Continued)

*Primary Examiner*—Jessica Han
(74) *Attorney, Agent, or Firm*—O'Melveny & Myers LLP (57) ABSTRACT

A pulse width modulation system for use in a switching power supply circuit provides high-resolution pulse width modulated signals. The pulse width modulation system is configured to receive a control signal comprising a (m+n)-bit binary word and to provide a pulse width modulated signal with a predetermined average duty cycle having a resolution of substantially $2^{-(m+n)}$. The pulse width modulation system includes a timing circuit for providing $2^m$ timing signals, a dithering circuit, and a signal generator. Upon receiving the control signal, the dithering circuit is configured to provide a modified control signal, which comprises a series of up to $2^n$ m-bit binary words. The signal generator is configured to receive the timing signals and the modified control signal and to provide the pulse width modulated signal having a duty cycle, which, when averaged over $2^n$ timing cycles, is approximately equal to the predetermined average duty cycle. The pulse width modulated signal is used by a switching power supply circuit to control at least one power switching device.

26 Claims, 5 Drawing Sheets

U.S. PATENT DOCUMENTS

| | | | |
|---|---|---|---|
| 4,538,073 | A | 8/1985 | Freige et al. |
| 4,538,101 | A | 8/1985 | Shimpo et al. |
| 4,616,142 | A | 10/1986 | Upadhyay et al. |
| 4,622,627 | A | 11/1986 | Rodriguez et al. |
| 4,654,769 | A | 3/1987 | Middlebrook |
| 5,053,920 | A | 10/1991 | Staffiere et al. |
| 5,073,848 | A | 12/1991 | Steigerwald et al. |
| 5,079,498 | A | 1/1992 | Cleasby et al. |
| 5,229,699 | A | 7/1993 | Chu et al. |
| 5,349,523 | A | 9/1994 | Inou et al. |
| 5,377,090 | A | 12/1994 | Steigerwald |
| 5,481,140 | A | 1/1996 | Maruyama et al. |
| 5,532,577 | A | 7/1996 | Doluca |
| 5,627,460 | A | 5/1997 | Bazinet et al. |
| 5,727,208 | A | 3/1998 | Brown |
| 5,752,047 | A | 5/1998 | Darty et al. |
| 5,815,018 | A * | 9/1998 | Soborski .................. 327/172 |
| 5,883,797 | A | 3/1999 | Amaro et al. |
| 5,892,933 | A | 4/1999 | Voltz |
| 5,905,370 | A | 5/1999 | Bryson |
| 5,917,719 | A | 6/1999 | Hoffman et al. |
| 5,929,618 | A | 7/1999 | Boylan et al. |
| 5,943,227 | A | 8/1999 | Bryson et al. |
| 5,946,495 | A | 8/1999 | Scholhamer et al. |
| 5,990,669 | A | 11/1999 | Brown |
| 6,057,607 | A | 5/2000 | Rader, III et al. |
| 6,115,441 | A | 9/2000 | Douglass et al. |
| 6,157,182 | A | 12/2000 | Tanaka et al. |
| 6,163,143 | A | 12/2000 | Shimamori |
| 6,163,178 | A | 12/2000 | Stark et al. |
| 6,191,566 | B1 | 2/2001 | Petricek et al. |
| 6,194,883 | B1 | 2/2001 | Shimamori |
| 6,208,127 | B1 | 3/2001 | Doluca |
| 6,211,579 | B1 | 4/2001 | Blair |
| 6,262,900 | B1 | 7/2001 | Suntio |
| 6,385,024 | B1 | 5/2002 | Olson |
| 6,392,577 | B1 | 5/2002 | Swanson et al. |
| 6,396,169 | B1 | 5/2002 | Voegli et al. |
| 6,396,250 | B1 | 5/2002 | Bridge |
| 6,421,259 | B1 | 7/2002 | Brooks et al. |
| 6,429,630 | B1 | 8/2002 | Pohlman et al. |
| 6,788,033 | B1 | 9/2004 | Vinciarelli |
| 6,829,547 | B1 | 12/2004 | Law et al. |
| 2002/0073347 | A1 | 6/2002 | Zafarana et al. |
| 2002/0105227 | A1 | 8/2002 | Nerone et al. |
| 2003/0122429 | A1 | 7/2003 | Zhang et al. |
| 2003/0142513 | A1 | 7/2003 | Vinciarelli |
| 2003/0201761 | A1 | 10/2003 | Harris |
| 2004/0090219 | A1 | 5/2004 | Chapuis |
| 2004/0093533 | A1 | 5/2004 | Chapuis et al. |
| 2004/0123164 | A1 | 6/2004 | Chapuis et al. |
| 2004/0123167 | A1 | 6/2004 | Chapuis |
| 2004/0135560 | A1 | 7/2004 | Kemahan et al. |
| 2004/0155640 | A1 | 8/2004 | Sutardja et al. |
| 2004/0178780 | A1 | 9/2004 | Chapuis |
| 2004/0246754 | A1 | 12/2004 | Chapuis |
| 2005/0093594 | A1 | 5/2005 | Kim et al. |

FOREIGN PATENT DOCUMENTS

| | | |
|---|---|---|
| EP | 0875994 | 11/1998 |
| EP | 0997825 | 5/2000 |
| GB | WO93/19415 | 9/1993 |
| RU | SU1814177 | 5/1993 |
| WO | WO02/31951 | 4/2002 |
| WO | WO02/50690 | 6/2002 |

OTHER PUBLICATIONS

"Electronic Products" Power Supply Special, The Engineer's Magazine of Product Technology, A Hearst Business Publication, vol. 37, No. 10, Mar. 1995, 4 pages.

"KEKB Power Supply Interface Controller Module" by A. Akiyama, T. Nakamura, M. Yoshida, T. Kubo, N. Yamamoto and T. Katoh. KEK, High Energy Accelerator Research Organization, 1-1 Ohio, Tsukuba 305, Japan, International Conference on Accelerator and Large Experimental Physics and Control Systems, 1997, Beijing, China, 4 pages, no month.

"Magnet Power Supply Control System in KEKB Accelerators" by T.T. Nakamura, A. Akiyama, T. Katoh, Ta. Kubo, N. Yamamoto, M. Yoshida. KEK, Tsukuba, Japan, International Conference on Accelerator and Large Experimental Physics Control Systems, 1999, Trieste, Italy, pp. 406-408, no month.

"Motorola Switch Mode Power Supply With Multiple Linear Regulators And High Speed CAN Transceiver", Motorola, Inc. 2002; digital dna; Analog Marketing; Rev. 2.5, Nov. 2002; 33394; Multi-Output Power Supply Semiconductor Technical Data.

"Power Management Solutions For Networking Applications"; Presented by Luc Darmon, Smart Networks Developer Forum 2003—Jun. 4-6 Euro-Disney Paris, France; Motorola digital dna; www.motorola.com/sndf; pp. 1-26.

Preliminary Information 1.5 A Switch-Mode Power Supply With Linear Regulator, 33701; Power Supply Integrated Circuit; Motorola Semiconductor Technical Data; Analog Marketing MC33701/D Rev. 1.0, May 2003; Motorola digital dna; pp. 1-24.

"Quantization Resolution and Limit Cycling in Digitally Controlled PWM Converters" by Angel V. Peterchev and A. V. Sanders, Electrical Engineering and Computer Science; UC Berkley; Power Electronics Specialists Conference, 2001.PESC, vol. 2, Jun. 17-21, 2001, pp. 465-471; XP002274573.

"System Management Bus Specification" Smart Battery System Specifications, Revision 1.1, Dec. 11, 1998, Copyright 1996, 1997, 1998, Benchmarq Microelectronics Inc., Duracell Inc., Energizer Power Systems, Intel Corporation, Linear Technology Corporation, Maxim Integrated Products, Mitsubishi Electric Corporation, National Semiconductor Corporation, Toshiba Battery Co., Varta Batterie AG, All rights reserved, 39 pages.

"The 12C-Bus Specification" Version 2.1, Jan. 2000, Document Order No. 9398 393 40011, pp. 1-46.

* cited by examiner

SYSTEM AND METHOD FOR PROVIDING DIGITAL PULSE WIDTH MODULATION

RELATED APPLICATION DATA

This patent application is a continuation of U.S. patent application Ser. No. 10/986,607, filed Nov. 11, 2004, which is a continuation of U.S. patent application Ser. No. 10/299,439, filed Nov. 19, 2002 now U.S. No. 6,833,691.

BACKGROUND OF THE INVENTION

1. Field of the Invention

The present invention relates generally to switching power supply circuits and more particularly, to pulse width modulation systems for use in switching power supply circuits.

2. Background of the Invention

Switching power supply circuits are commonly used to convert an input AC or DC voltage or current to a different AC or DC voltage or current output. Such circuits typically include one or more switching devices (e.g., MOSFETS) and passive component(s) (e.g. inductors, capacitors) to convert energy from the input source to the output. It is known to use a pulse width modulation device to turn on and off the switching devices at a desired frequency. The pulse width modulation device regulates the output voltage, current or power delivered by the switching power supply circuit by varying the duty cycle applied to the switching devices.

Pulse width modulation devices such as these provide a simple, yet effective, tool for providing pulse width modulated signals with relatively precise durations and duty cycles and have been used in myriad applications, such as voltage regulation modules, DC/DC converters, and other electronic devices. To simplify the integration in conjunction with digital control systems, digitally-controlled pulse width modulation systems have been developed. These digitally-controlled pulse width modulation systems have been implemented in several forms, including as counters supplied by a high frequency clock, ring oscillators with a multiplexer together and with look-up tables.

As the desired resolution of the pulse width modulated signals continues to increase, existing digitally-controlled pulse width modulation systems have proven to be unsatisfactory in many respects. For example, high-resolution pulse width modulated signals provided by the digitally-controlled pulse width modulation systems can include waveform discontinuities and can lead to noise and oscillator sub-harmonics. Increased resolution also generally corresponds with very high oscillator frequencies, which can exceed one gigacycle.

In view of the foregoing, it is believed that a need exists for an improved pulse width modulation system that overcomes the aforementioned obstacles and deficiencies of currently-available pulse width modulation systems. More particularly, a need exists for high resolution pulse width modulation system for use in switching power supply circuits.

SUMMARY OF THE INVENTION

The present invention is directed toward a pulse width modulation system that is configured to receive a control signal and to provide a high-resolution pulse width modulated signal having a predetermined average duty cycle.

The pulse width modulation system includes a timing circuit, a dithering circuit, and a signal generator. The timing circuit is configured to provide one or more timing signals for the pulse width modulation system. Each of the timing signals can provide one timing pulse in accordance with a predetermined sequence during each timing cycle of the timing circuit. The dithering circuit is configured to receive the control signal and to provide a modified control signal. Upon receiving the modified control signal and the plurality of timing signals, the signal generator is configured to provide the pulse width modulated signal with a duty cycle, which, when averaged over a plurality of timing cycles, is approximately equal to the predetermined average duty cycle.

If the control signal comprises a (m+n)-bit binary word, for example, the pulse width modulation system can be configured to provide the pulse width modulated signal with the predetermined average duty cycle having a resolution of substantially $2^{-(m+n)}$. The timing circuit is configured to provide $2^m$ timing signals and the dithering circuit is configured to dither the control signal such that the modified control signal is a series of up to $2^n$ m-bit binary words. The signal generator is configured to receive the $2^m$ timing signals and the series of $2^n$ m-bit binary words of the modified control signal and provide the pulse width modulated signal. When the duty cycle of the width modulated signal is averaged over a maximum of $2^n$ timing cycles, the average duty cycle is approximately equal to the predetermined average duty cycle. The combination of the dithering circuit and the signal generator may provide the highest possible dithering frequency such that the system avoids the low frequency components in the spectrum of the pulse width modulated system. As a result, the present invention is ideally suited for power applications such as switching power supply circuits to reduce low frequency noise on the output.

Other aspects and features of the present invention will become apparent from consideration of the following description taken in conjunction with the accompanying drawings.

BRIEF DESCRIPTION OF THE DRAWINGS

It should be noted that the figures are not drawn to scale and that elements of similar structures or functions are generally represented by like reference numerals for illustrative purposes throughout the figures. It also should be

DETAILED DESCRIPTION OF THE PREFERRED EMBODIMENTS

Figure 1:
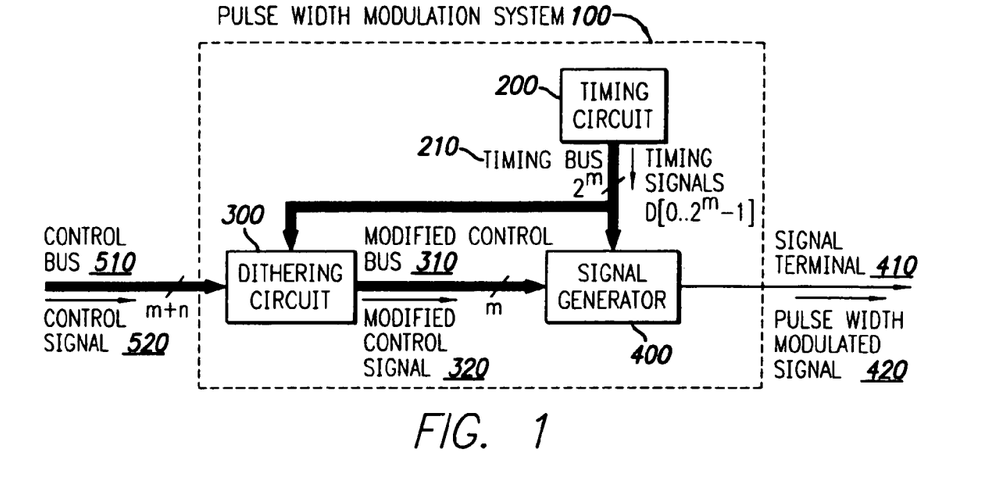
FIG. 1 is an exemplary block diagram of one embodiment of a pulse width modulation system in accordance with the present invention.

Because current pulse width modulation systems require very high frequency oscillators, are susceptible to noise and oscillator sub-harmonics, or both, a pulse width modulation system that utilizes advanced digital control schemes to provide high-resolution pulse width modulated signals can prove much more desirable and provide a basis for a wide range of electronic applications, such as voltage regulation modules and power systems. This result can be achieved, according to one exemplary embodiment of the present invention, by employing a pulse width modulation system 100 as shown in FIG. 1.

The pulse width modulation system 100 may receive a control signal 520 via control bus 510 and transmit a high-resolution pulse width modulated signal 420 via signal terminal 410. The control signal 520 may include any type of control signal and, in a preferred embodiment, control signal 520 is a digital control signal that includes a binary word with a predetermined number of bits, such as a (m+n)-bit binary word. The decimal numbers m and n each can be any positive, real integer. The bits comprising the (m+n)-bit binary word of the control signal 520 can be communicated to the pulse width modulation system 100 in any manner, including via a serial or parallel data transfer. Upon receiving the control signal 520, the pulse width modulation system 100 transmits the pulse width modulated signal 420. As will be described in more detail below, if the control signal 520 includes the (m+n)-bit binary word, the pulse width modulated signal 420 has an average duty cycle having a resolution of substantially $2^{-(m+n)}$. Accordingly, the average duty cycle of the pulse width modulated signal 420 is equal to a quotient of a decimal equivalent of the (m+n)-bit binary word and two raised to the (m+n)$^{th}$ power as shown in Equation 1.

$$\text{Average Duty Cycle} = \frac{\text{CONTROL\_SIGNAL}_{10}}{2^{(m+n)}} * 100\% \quad \text{Equation 1}$$

CONTROL_SIGNAL$_{10}$ is the decimal equivalent of the (m+n)-bit binary word of the control signal 520. For example, if m=2 and n=1, the control signal 520 may be the three-bit binary word $101_2$. In this example, because the three-bit binary word $101_2$ is equivalent to the decimal number $5_{10}$, the pulse width modulation system 100 provides the resultant pulse width modulated signal 420 with the average duty cycle that is substantially equal to $((5/2^{(2+1)})*100\%)$, or 62.5%.

The pulse width modulation system 100 can be provided in any manner, such as with one or more integrated components and/or discrete components. In the exemplary embodiment shown in FIG. 1, the pulse width modulation system 100 includes a timing circuit 200, a dithering circuit 300, and a signal generator 400. Generally, dithering circuit 300 receives and dithers a control signal 520 to produce a modified control signal 320 that is sent to the signal generator 400. The timing circuit 200 generates and transmits (a) timing signal(s) to the dithering circuit 300 and the signal generator 400. Upon receiving the modified control signal and the timing signal, the signal generator produces the high-resolution pulse width modulated signal 420.

Figure 2A:
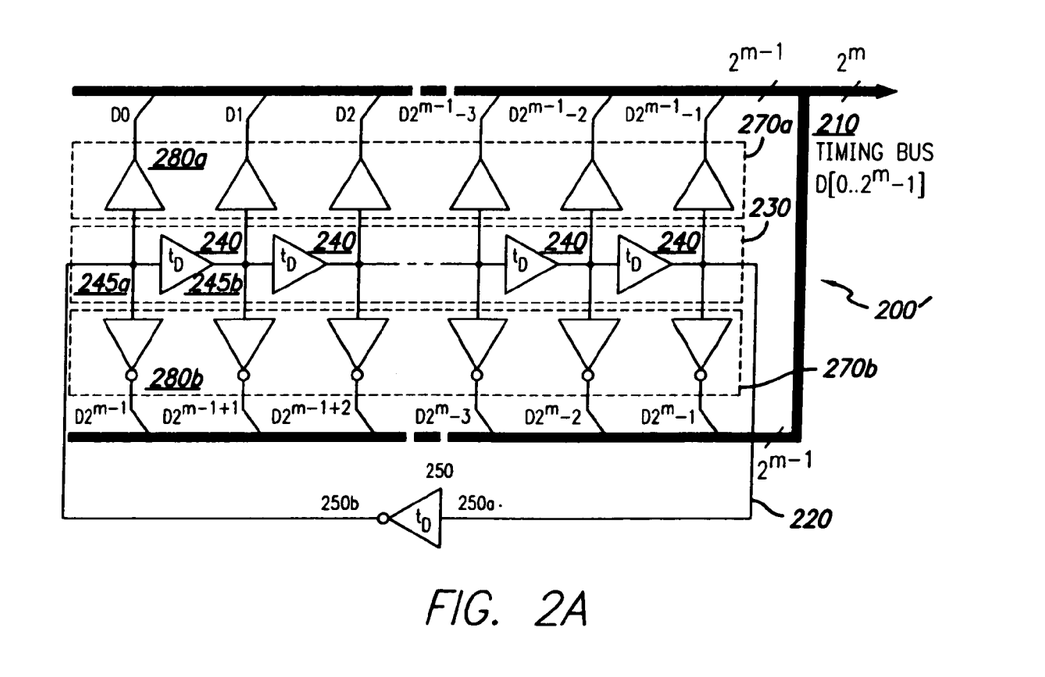
FIG. 2A illustrates one embodiment of a timing circuit for providing the timing signals.

As discussed above, the timing circuit 200 provides one or more timing signals for the pulse width modulation system 100 via a timing bus 210. The type of timing signals provided by timing circuit 200 may be based on control signal 520. For example, if the control signal 520 comprises the (m+n)-bit binary word, the timing circuit 200 may provide $2^m$ timing signals D[0 . . . $2^m$–1]. An exemplary embodiment of the timing circuit 200 is shown in FIG. 2A, shown as timing circuit 200'. The timing circuit 200' includes a ring oscillator 220 to carry a ring oscillator signal. The ring oscillator 220 may include a digital delay line 230 that includes a number of delay elements 240. As shown in FIG. 2A, the delay elements 240 may be non-investing delay elements. The timing circuit 200' may also include or be connected to a delay bus or timing bus 210 that carries the $2^m$ timing signals D[0 . . . $2^m$–1]. As discussed below, the positive and negative slopes of two adjacent timing signals are delayed by time $t_d$. This $t_d$ delay is provided by the delay elements of 240 of the digital delay line 230. Because there are $2^m$ timing signals, digital delay line 230 preferably includes $2^{m-1}$ delay elements 240 and one inverting delay element 250 configured in series, each delay element 240 configured to receive an input signal 245$a$ and delay this input signal 245$a$ by $t_d$ to produce an output signal 245$b$. The output signals 245$b$ may then be sent to the timing bus 210 as timing signals D[0 . . . $2^m$–1] via interface blocks 270$a$ and 270$b$ and to the next delay element 240 in the delay line 230. Accordingly, the digital delay line 230 propagates the ring oscillator signal through successive delay elements 240 in order to generate a series of timing signals D[0 . . . $2^m$–1] in which each timing signal is delayed by time $t_d$ from the previous timing signal. As discussed below, the timing cycle TC of the timing circuit 200' is equal to twice the total delay imposed by the delay line 230.

The timing circuit 200' may include interface blocks 270$a$ and 270$b$ to provide low impedance outputs for the delay line 230. In the exemplary embodiment shown in FIG. 2A, interface block 270$a$ is a non-inverting block that includes non-inverting elements 280$a$ to generate the first half of the timing bus 210 and interface block 270$b$ is an inverting block that includes inverting elements 280$b$ to generate the second half of the timing bus 210. Timing circuit 200' may also include a feedback inverter 250 to close the ring of ring oscillator 220. Feedback inverter 250 preferably provides the same delay $t_d$ as delay element 240.

An exemplary embodiment of the timing signals D[0 . . . $2^m$–1] produced by the timing circuit 200' is shown in the timing diagram of FIG. 2B. Each of the timing signals D[0 . . . $2^m$–1] are a series of voltage or current pulses P with uniform pulse width. Each of the timing signals D[0 . . . $2^m$–1] provides one pulse P in accordance with a predetermined sequence during each timing cycle TC of the timing circuit 200. The timing cycle TC is substantially $2^m$ periods $t_d$. The width of each pulse P is substantially $2^{m-1}$–1 periods $t_d$. Consecutive timing signals D[0 . . . $2^m$–1] initiate one pulse P at a time because the positive (and negative) slopes of two consecutive time signals are delayed by delay $t_d$. Accordingly, the time between the leading or positive slopes of any two consecutive signals is time $t_d$. As discussed above, this delay is provided by digital delay line 230. For example, the timing signal $D_0$ provides a pulse P at time t=0 and then the timing signal $D_1$ provides a pulse P at time t=$t_d$, and so on, until timing signal $D_0$ again provides a pulse P at time $2^m$*T. At time $2^m$*T, the timing circuit 200 enters another timing cycle TC, and the timing signals D[0 . . .

Figure 2B:
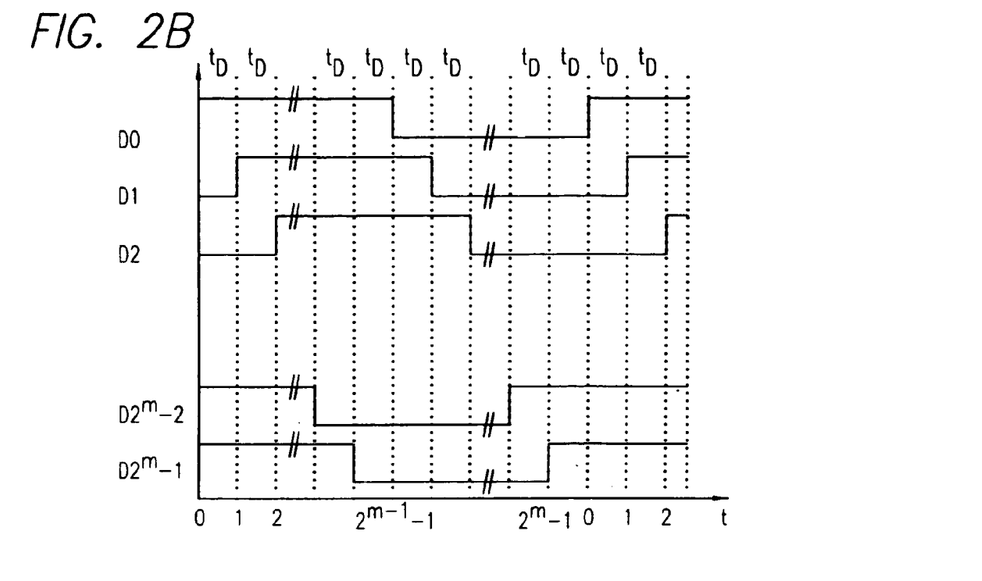
FIG. 2B is an illustrative timing diagram of internal timing signals provided by the timing circuit of FIG. 2A.

$2^m-1$] again provide the pulses P, substantially repeating the predetermined sequence described above. The timing signals D[0 . . . $2^m-1$] continue to repeat the predetermined sequence of pulses P for each successive timing cycle TC.

As discussed above, the dithering circuit 300 is configured to receive the control signal 520, e.g., the (m+n) bit word of the control signal, and provide a modified control signal 320. Preferably, the dithering circuit 300 is a (m+n)-bit to m-bit dithering circuit and is configured to dither the (m+n)-bit binary word of the control signal 520 to form the modified control signal 320 as a predetermined series of up to $2^n$ m-bit binary words. Although the pulse width modulation system 100 can be configured to operate without the dithering circuit 300 such that the (m+n)-bit binary word of the control signal 520 is communicated substantially directly to the signal generator 400, the pulse width modulation system 100 preferably includes the dithering circuit 300 to reduce the number of timing signals D[0 . . . $2^m-1$] to be provided by the timing circuit 200 from $2^{(m+n)}$ to $2^m$. For the pulse width modulation system 100 to provide the pulse width modulated signal 420 having the average duty cycle with a resolution of substantially $2^{-(m+n)}$, the $2^n$ m-bit binary words of the modified control signal 320 can remain substantially uniform or vary for each preselected (m+n)-bit binary word of the control signal 520 in the manner described in more detail below. When measured over substantially $2^n$ timing cycles TC, the average duty cycle of the pulse width modulated signal 420 is substantially equal to the expected duty cycle in accordance with Equation 1.

Figure 3:
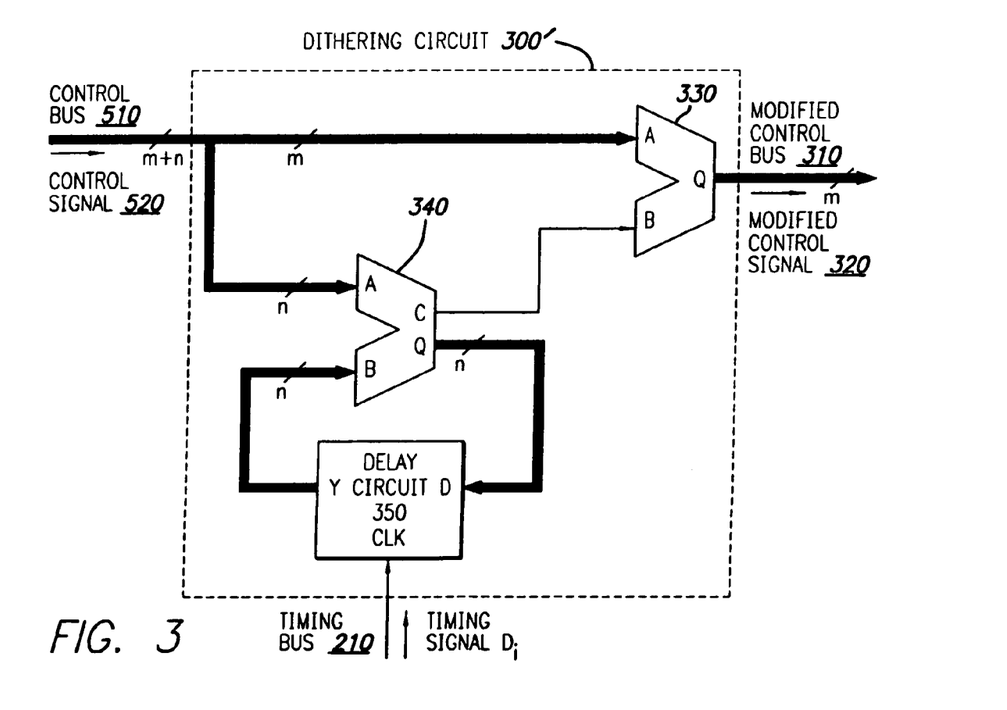
FIG. 3 illustrates one exemplary embodiment of a dithering circuit for the pulse width modulation system of FIG. 1.

An exemplary embodiment of the dithering circuit 300 is shown in FIG. 3. The dithering circuit 300' includes an m-bit adder circuit 330 and a phase accumulator consisting of an n-bit adder circuit 340, and a delay circuit 350. The n-bit adder circuit 340 includes input operand terminals A and B, output sum terminal Q, and a carry terminal C. The n-bit adder circuit 340 receives two n-bit binary words via the input operand terminals A and B and provides an n-bit binary sum of the n-bit binary words via the output sum terminal Q. The carry terminal C of the n-bit adder circuit 340 provides a carry bit from the n-bit binary sum.

The m-bit adder circuit 330 includes input operand terminals A, at least one input operand terminal B, and output sum terminals Q. The m-bit adder circuit 330 receives an m-bit binary word via the input operand terminals A and a second binary word of at least one bit via the input operand terminal B and provides an m-bit binary sum of the m-bit binary word and the second binary word via the output sum terminals Q. The delay circuit 350 may be any type of register or delay circuit and is preferably an n-bit delay circuit. The input terminals D of the delay circuit 350 may receive an n-bit binary word, which is communicated to the output terminals Y of the delay circuit 350 when an appropriate signal is received at the clock terminal CLK.

The input operand terminal A of the m-bit adder circuit 330 and the input operand terminal A of the n-bit adder circuit 340 are each connected to the control bus 510. The input operand terminal A of the m-bit adder circuit 330 receives the m most significant bits (MSBs) of the (m+n)-bit binary word of the control signal 520 and the input operand terminal A of the n-bit adder circuit 340 receives the n least significant bits (LSBs) of the (m+n)-bit binary word. The carry terminal C of the n-bit adder circuit 340 is connected with the input operand terminal B of the m-bit adder circuit 330. The output sum terminal Q and the input operand terminal B of the n-bit adder circuit 340 are connected to the input terminal D and the output terminal Y, respectively, of the delay circuit 350. The m-bit adder circuit 330 may provide the m-bit binary sum as the modified control signal 320 to the modified control bus 310 via the output sum terminals Q.

The clock terminal CLK of the delay circuit 350 may receive a timing signal $D_i$ from the timing circuit 200. The timing signal $D_i$ may be any of the timing signals D[0 . . . $2^m-1$], as shown in FIG. 2A. If the timing cycle TC of the timing circuit 200 begins with the positive pulse slope of the timing signal $D_0$, e.g., as the signal transitions to the high logic signal state, for example, the timing signal $D_i$ is preferably one of the timing signals D[1 . . . $2^m-2$] to permit the output sum terminals Q of the n-bit adder circuit 340 to stabilize before the timing signal $D_i$ activates the delay circuit 350. Although the timing signal $D_i$ can activate the delay circuit 350 in any manner, the delay circuit 350 preferably is activated with the positive slope of the timing signal $D_i$. As was discussed in more detail above, the positive slope of timing signal $D_i$, e.g., as the signal transitions from the first signal state to the second signal state and back to the first signal state, occurs once during each timing cycle TC. Therefore, for each timing cycle TC, the delay circuit 350 may provide the input operand terminals B of the n-bit adder circuit 340 with the n-bit binary sum that the n-bit adder circuit 340 provided during the preceding timing cycle TC.

Figure 4A:
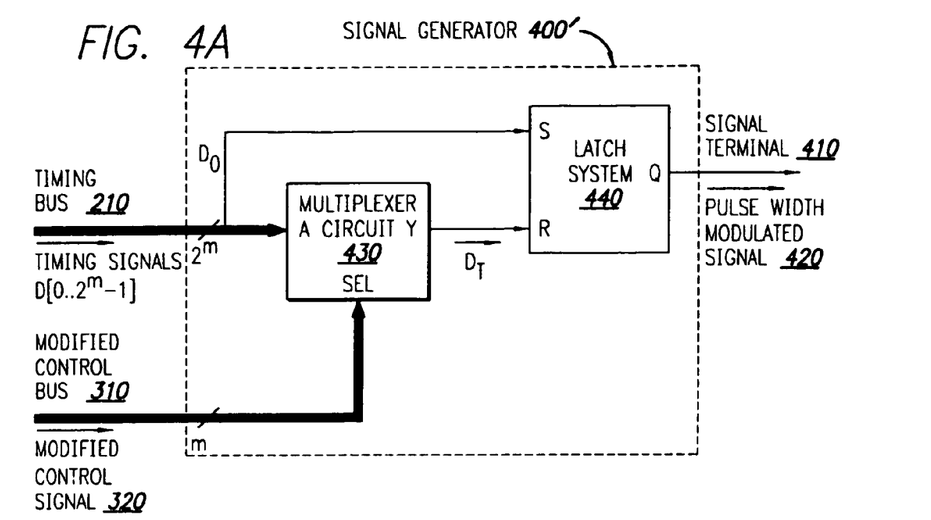
FIG. 4A illustrates an exemplary embodiment of a signal generator for the pulse width modulation system of FIG. 1.

As discussed above, upon receiving the m-bit binary word of the modified control signal 320, the signal generator 400 is configured to provide the pulse width modulated signal 420. An exemplary embodiment of the signal generator 400 is shown in FIG. 4A. The signal generator 400 includes a multiplexer circuit 430 and a latch system 440. Multiplexer circuit 430 includes data input terminals A, select input terminals SEL, and a data output terminal Y. The multiplexer circuit 430 is preferably a $2^m$-to-1 multiplexer circuit, having at least $2^m$ data input terminals A and m select input terminals SEL, and may select among the data input terminals A via the select input terminals SEL such that signals received via the selected data input terminal A are communicated to the data output terminal Y.

The latch system 440 includes a set terminal S, a reset terminal R, and an output terminal Q. The latch system 440 is configured to provide an output signal via the output terminal Q. The output signal can have a first signal state with a high logic level, e.g., "1," when the set terminal S receives a signal with a positive transition, e.g., a logic level transition from a low to a high logic level. In contrast, if the reset terminal R receives a signal with a positive transition, e.g., a logic level transition from a low to high logic level, the latch system 440 will provide the output signal with the low logic level of the second signal state.

As shown in FIG. 4A, the data input terminals A of the multiplexer circuit 430 are connected to the timing bus 210 to receive the timing signals D[0 . . . $2^m-1$], and the select input terminals SEL are connected to the modified control bus 310 to receive the modified control signal 320. The multiplexer circuit 430 may provide a selected timing signal $D_T$ via the output terminal Y. The selected timing signal $D_T$ can be any of the timing signals D[0 . . . $2^m-1$] and is selectable via the modified control signal 320. The timing bus 210 is also connected to the set terminal S of the latch system 440 such that the timing signal $D_0$ is communicated to the set terminal S. The output terminal Y of the multiplexer circuit 430 is connected to the reset terminal R of the latch system 440 such that the selected timing signal $D_T$ is communicated to the reset terminal R. The output terminal Q of the latch system 440 provides the pulse width modulated signal 420 via the signal terminal 410.

Figure 4B:
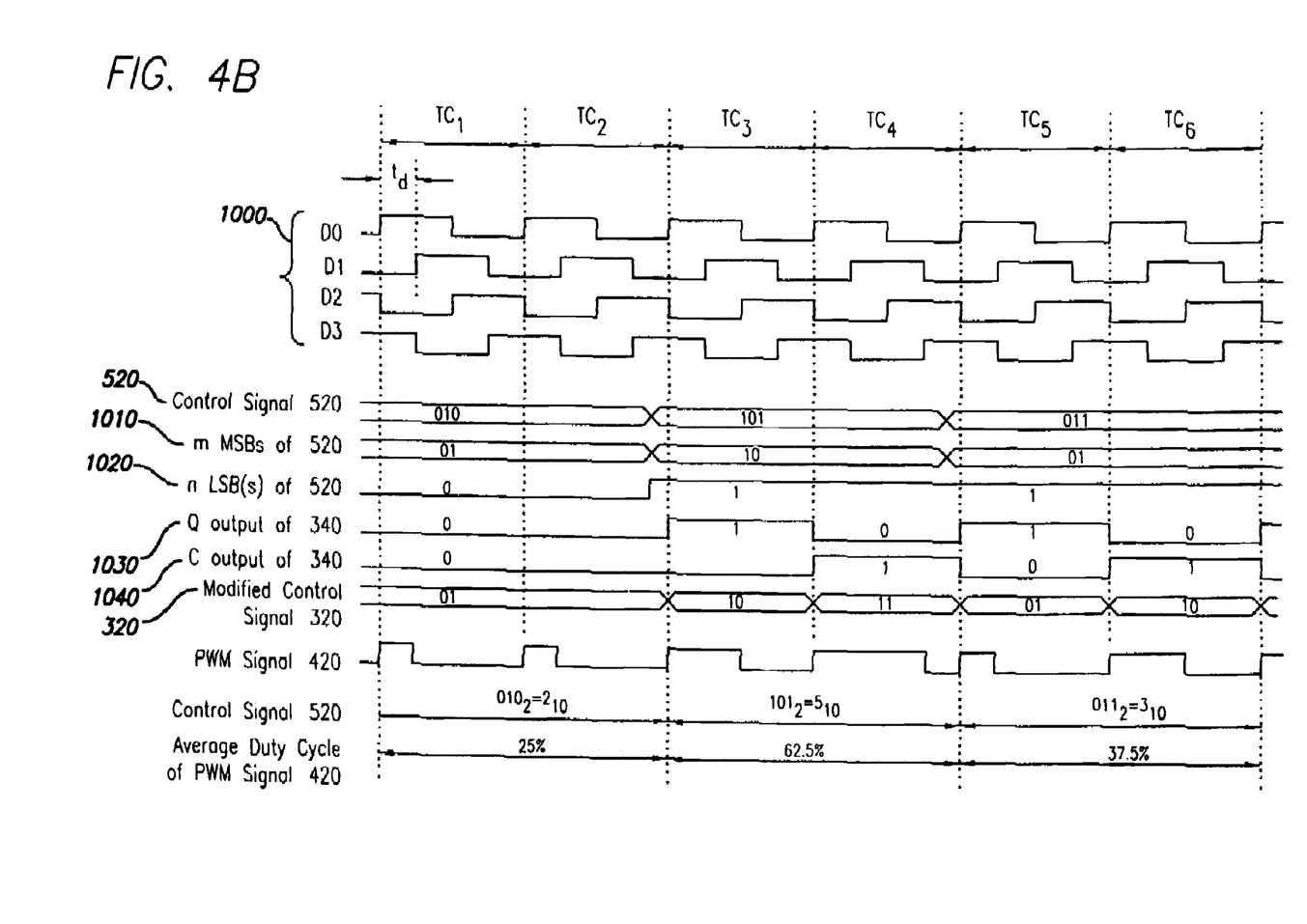
FIG. 4B is an illustrative timing diagram of a pulse width modulated signal provided by the signal generator of FIG. 4A.

An exemplary timing diagram is provided in FIG. 4B to illustrate the operation of the pulse width modulation system 100 for a variety of preselected control signals 520. As discussed above, the binary words comprising the control signal 520 can have any predetermined number of (m+n) bits to contain the requested pulse width. In the example shown in FIG. 4B, m=2 and n=1. Accordingly, the control signal 520 shown in FIG. 4B has three bits $m_1$, $m_0$, and $n_0$. Because the control signal 520 includes two m-bits $m_1$, $m_0$, the timing circuit 200 is configured to provide four timing signals D[0 . . . 3], shown as the timing bus signals 1000 in FIG. 4B. The dithering circuit 300', as shown in the exemplary embodiment illustrated in FIG. 3, is configured such that the timing signal $D_t$ transmitted to clock of delay circuit 350 is the timing signal $D_0$ and the output terminal Y of the delay circuit 350 initially provides the one-bit binary word "1." Signal 1010 corresponds to the m most significant bit(s) (MSB) of control signal 520 that are communicated to terminals A of adder 330 of the dithering circuit 300', as shown in FIG. 3. Signal 1020 corresponds to the n least significant bit(s) (LSB) of control signal 520 that are communicated to terminals A of adder 340 of the dithering circuit 300'. Accordingly, signal 1020 contains the fractional value of the requested pulse width and controls the phase accumulator, e.g., the adder 340 and the register 350, as shown in FIG. 3. Signal 1030 is the Q output of adder 330 of the dithering circuit 300'. Accordingly, signal 1030 is the phase accumulation signal because it is the sum of the consecutive n LSB(s) of control signal 520 modulo $2^n$.

Signal 1040 is the C output of adder 340 of dithering circuit 300'. As discussed above, each time the adder 340 overflows, a carry is generated via the C output. The average value of this signal 1040 is $0 \leq \{[value(n\ LSBs)]/2^n\} < 1$. As discussed above, the modified control signal 320 is generated by dithering circuit 300. The adder 330 adds 1 to the m MSB of control signal 320 whenever the carry of adder 340 is set. The average value of the modified control signal 320 is therefore equal to value(m MSBs)+[value(n LSBs)/$2^n$]. Accordingly, in the above example, the values are 0, 0.5, 1, 1.5, 2, 2.5, 3, and 3.5. As discussed above, pulse width modulated signal 420 is the modified control signal 320 that has been transformed by the signal generator 400.

The pulse width modulated signal 420 has a pulse width of value (modified control signal 320)/$2^m$. This is equivalent to value (control signal 520)/$2^{m+n}$. In the above example, the average pulse widths are therefore: 0%, 12.5%, 25%, 37.5%, 50%, 62.5%, 75% and 87.5%. FIG. 4b shows the signals for 25%, 62.5% and 37.5%. For example, for the first and second timing cycles $TC_1$ and $TC_2$, the control signal 520 comprises the three-bit binary word "010" as shown in FIG. 4B. Because the decimal equivalent of the three-bit binary word "010" is $2_{10}$, the average duty cycle of the resultant pulse width modulated signal 420 is expected to be approximately 25% pursuant to Equation 1. Before the third timing cycle $TC_3$ begins, the control signal 520 is changed to the three-bit binary word "101." Because the decimal equivalent of the three-bit binary word "101" is $5_{10}$, the average duty cycle of the resultant pulse width modulated signal 420 is expected to be approximately 62.5%. Similarly, the control signal is "011" during the fifth and sixth timing cycles $TC_5$ and $TC_6$, resulting in the pulse width modulated signal 420 having an average duty cycle of approximately 37.5%.

Figure 5:
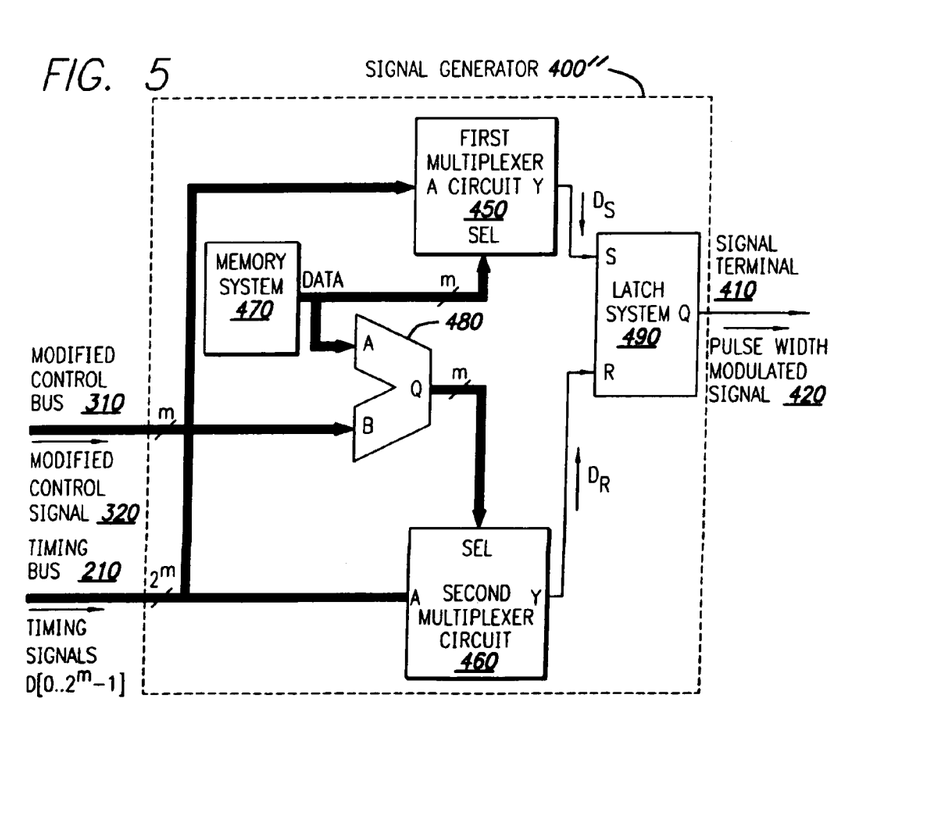
FIG. 5 illustrates an alternative exemplary embodiment of the signal generator of FIG. 1.

In an alternative embodiment, signal generator 400 may be configured to allow the pulse width modulated signal 420 to transition from the second signal state to the first signal state, e.g., a positive slope, substantially coincident with any timing signal D[0 . . . $2^m$-1]. Accordingly, the signal generator 400 may allow a user to select or change the start of the pulse width modulated signal. This ability is useful if several pulse width modulated signals must be generated such that each signal is phase shifted with respect to each other. FIG. 5 shows an exemplary embodiment of the signal generator 400, shown as the signal generator 400", that allows the delay of the positive slope of the pulse width modulation signal 420 with reference to the $D_0$ timing signal of the ring oscillator 220. The signal generator 400" includes a first multiplexer circuit 450, a second multiplexer circuit 460, a memory system 470, an adder circuit 480, and a latch system 490. The first and second multiplexer circuits 450, 460 each include data input terminals A, select input terminals SEL, and a data output terminal Y. The memory system 470 is preferably a non-volatile memory system and includes a memory register and data terminals DATA. The memory system 470 is configured to store or provide a phase signal 475. The phase signal 475 comprises an m-bit binary word and is provided via the data terminals DATA of the memory system 470. The phase shift of the pulse width modulated signal 420 is equal to a quotient of a decimal equivalent of the m-bit binary word of the phase signal 475 and two raised to the $m^{th}$ power as shown in Equation 2.

$$\text{Phase Shift} = \frac{\text{PHASE\_SIGNAL}_{10}}{2^m} * 360° \quad \text{Equation 2}$$

PHASE_SIGNAL$_{10}$ is the decimal equivalent of the m-bit binary word of the phase signal 475. For example, if m=2, the phase signal 475 can comprise the two-bit binary word $10_2$. Because the two-bit binary word $10_2$ is equivalent to the decimal number $2_{10}$, the pulse width modulation system 100 is configured to provide the resultant pulse width modulated signal 420 with the phase shift that is substantially equal to $((2/2^{(2)})*360°)$, or 180°. As desired, the phase signal 475 can be preprogrammed as a predetermined m-bit binary word or can be reprogrammable.

The adder circuit 480 has input operand terminals A and B and output sum terminals Q. The adder circuit 480 may receive two m-bit binary words via the input operand terminals A and B and to provide an m-bit binary sum of the m-bit binary words via the output sum terminal Q. The latch system 490 includes a set terminal S, a reset terminal R, and an output terminal Q and is configured to receive input signals via the set and reset terminals S, R and to provide an output signal via the output terminal Q in response to the input signals.

As shown in FIG. 5, the data input terminal A of the first multiplexer circuit 450 and the data input terminal A of the second multiplexer circuit 460 are each connected with the timing bus 210 and configured to receive the timing signals D[0 . . . $2^m$-1]. The input operand terminal B of the adder circuit 480 is connected to the modified control bus 310 and configured to receive the modified control signal 320. The DATA terminals of the memory system 470 are connected to the select input terminals SEL of the first multiplexer circuit 450, and the output terminal Y of the first multiplexer circuit 450 is connected to the set terminal S of the latch system 490. The first multiplexer circuit 450 is configured to provide a first selected timing signal $D_s$ via the output terminal Y. Timing signal $D_s$ may be any of the timing signals D[0 . . . $2^m$-1] and is selectable via the phase signal 475 provided by the memory system 470.

The DATA terminals of the memory system 470 are connected to the input operand terminals A of the adder circuit 480, and the output terminal Q of the adder circuit 480 is connected to the select input terminals SEL of the second multiplexer circuit 460. The second multiplexer circuit 460 is configured to provide a second selected timing signal DR via the output terminal Y. The second selected timing signal DR may be any of the timing signals D[0 . . . $2^m$–1] and is selectable via the m-bit binary sum of the phase signal 475 and the modified control signal 320 as provided by the adder circuit 480 via the output terminal 0. The first and second multiplexer circuits 450, 460 are respectively configured to communicate the first and second selected timing signals $D_S$, $D_R$ to the set and reset terminals S, R of the latch system 490. The output terminal Q of the latch system 490 is configured to provide the pulse width modulated signal 420 via the signal terminal 410. Signal generator 400" therefore allows for the selection of timing signals based on the selected phase shift. Accordingly, the signal generator 400" is able to produce a pulse width modulated signal 420 that is phase shifted in accordance with the phase signal 475.

Figure 6:
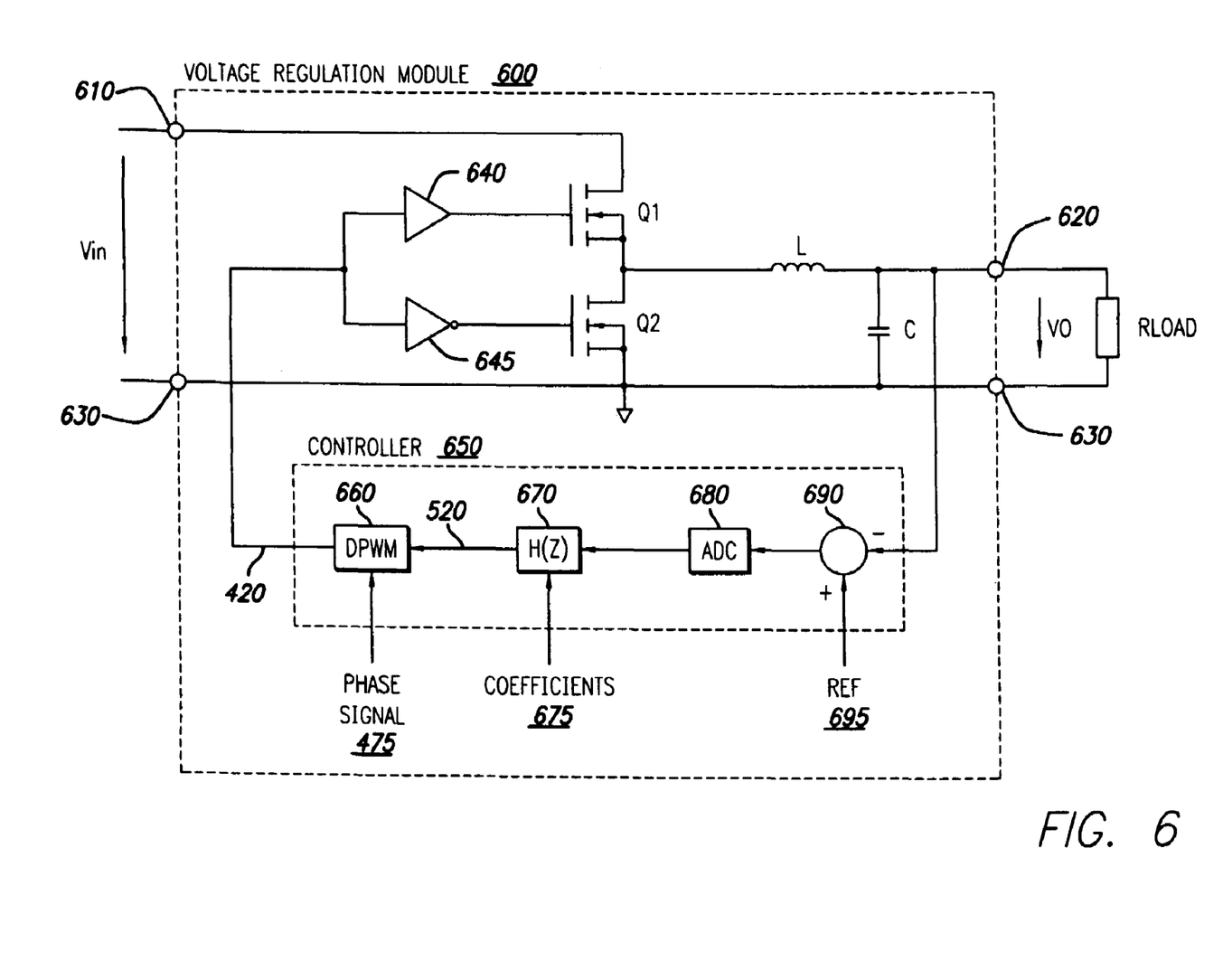
FIG. 6 illustrates a voltage regulation module incorporating an exemplary embodiment of the pulse width modulation system of the present invention.

As discussed above, the pulse width modulation system 100 of the present invention can be used in a wide range of electronic applications and systems, such as, for example, switching power supply systems. For instance, FIG. 6 shows an exemplary embodiment of a voltage regulation module (VRM) 600 according to the present invention. The voltage regulation module 600 may be a component of another system, such as a power system, for example. The voltage regulation module 600 has an input stage and an output stage accessible via an input terminal 610 and an output terminal 620 with a return terminal 630. Generally, voltage regulation module is designed to convert the input voltage $V_{in}$ between the terminals 610 and 630 into an output voltage $V_o$ between the terminals 620 and 630. The voltage regulation module 600 includes a L/C low pass filter driven by switching elements Q1 and Q2. A non-inverting driver 640 and an inverting driver 645 are provided for power switches Q1 and Q2, respectively, and these drivers are both controlled or activated by a pulse width modulated control signal 420.

The voltage regulation module also includes an output voltage controller 650. The output voltage controller 650 includes an error voltage generator 690 with a reference input 695, an analog to digital converter (ADC) 680, a digital filter 670 and a digital pulse width modulator 660. The ADC 680 converts the analog error signal generated from error voltage generator 690 into a corresponding digital signal. The digital filter 670 may define a filter transfer function based on coefficients 675. The digital filter 670 may apply this transfer function to the digital signal to provide stability for the feedback loop. The digital filter 670 thereby outputs the control signal 670. The control signal 670 is received by the digital pulse width modulator 660. The digital pulse width modulator 660 then produces the pulse width modulated signal 420 as described above to control switches Q1 and Q2. As discussed above, the pulse width modulated signal 420 is a pulse sequence with dithered pulse widths with the highest possible repetition frequency, e.g., the repetition frequency of the carry signal of the adder 340 of the dithering circuit 300 realizing the required duty cycle has the maximum possible frequency. As a result, this pulse width modulated signal is useful in DC/DC converters, as illustrated in FIG. 6, to reduce possible low frequency noise on the output. Accordingly, the pulse width modulator 660 of the present invention is useful for generating a pulse width for DC/DC (or AC/DC) power conversion.

The invention is susceptible to various modifications and alternative forms, and specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the claims.

What is claimed is:

1. In a switching power supply system having at least one switching element, a control circuit for driving said at least one switching element comprises:
   a dithering circuit adapted to receive a control signal comprising a (m+n)-bit binary word, where m and n are positive integers, and to provide a modified control signal;
   a timing circuit adapted to provide $2^m$ timing signals and to communicate at least one of said timing signals to said dithering circuit; and
   a signal generator adapted to receive said modified control signal and said timing signals and to provide a pulse width modulated signal to said at least one switching element, said pulse width modulated signal activating said at least one switching element with an average duty cycle that relates to the (m+n)-bit binary word divided by $2^{(m+n)}$.

2. The control circuit of claim 1, wherein said dithering circuit is adapted to calculate said modified control signal.

3. The control circuit of claim 2, wherein said dithering circuit includes an n-bit binary adder circuit, an n-bit delay circuit, and an m-bit binary adder circuit, said n-bit binary adder having first input operand terminals for receiving n least significant bits of said control signal, second input operand terminals, output sum terminals being coupled with said second input operand terminals via said n-bit delay circuit, and a carry terminal, said n-bit delay circuit being activated by said at least one of said timing signals, said m-bit binary adder circuit having first input operand terminals for receiving m most significant bits of said control signal, second input operand terminals being coupled with said carry terminal, and output terminals for providing said modified control signal.

4. The control circuit of claim 1, wherein said each of said timing signals comprises a voltage pulse having a predetermined period during each timing cycle of the timing circuit, said timing cycle being substantially equal to $2^m$ of said predetermined periods.

5. The control circuit of claim 4, wherein said timing signals provide said voltage pulses in accordance with a predetermined sequence.

6. The control circuit of claim 1, wherein said timing circuit comprises a ring oscillator.

7. The control circuit of claim 1, wherein said timing circuit includes a delay line and an inverter circuit, said delay line having an input terminal and an output terminal respectively coupled with an output terminal and an input terminal of said inverter circuit.

8. The control circuit of claim 7, wherein said delay line comprises at least $2^m$ delay elements.

9. The control circuit of claim 6, wherein said delay elements comprise buffer circuits.

10. The control circuit of claim 6, wherein said delay elements comprise inverter circuits.

11. The control circuit of claim 6, wherein each of said delay elements is adapted to provide a delay period that is less than or substantially equal to ten nanoseconds.

12. The control circuit of claim 1, wherein said signal generator is adapted to provide said pulse width modulated signal with a phase shift.

13. The control circuit of claim 12, wherein said phase shift is preprogrammed.

14. The control circuit of claim 12, wherein said phase shift is programmable.

15. The control circuit of claim 1, wherein said signal generator includes a latch system for providing said pulse width modulated signal.

16. The control circuit of claim 15, wherein said latch system is adapted to provide said pulse width modulated signal with a first signal state upon receiving a first timing signal and with a second signal state upon receiving said second timing signal.

17. The control circuit of claim 16, wherein said first signal state is associated with a high logic level, and said second signal state is associated with a low logic level.

18. The control circuit of claim 16, wherein said signal generator further includes a multiplexer circuit configured to receive said modified control signal and to select said second timing signal.

19. The control circuit of claim 16, wherein said signal generator further includes a first multiplexer circuit configured to receive a phase signal and to select said first timing signal and a second multiplexer circuit configured to receive a sum of said phase signal and said modified control signal and to select said second timing signal.

20. The control circuit of claim 19, wherein said phase signal comprises an m-bit binary word.

21. The control circuit of claim 19, wherein said signal generator further includes a memory system for providing said phase signal.

22. A method for providing pulse width modulated signals, comprising:

receiving a control signal comprising a (m+n)-bit binary word, where m and n are positive integers;

dithering said control signal to provide a modified control signal;

providing $2^m$ timing signals; and generating a pulse width modulated signal with an average duty cycle that relates to the (m+n)-bit binary word divided by $2^{(m+n)}$.

23. The method of claim 22, wherein said dithering said control signal comprises calculating said modified control signal.

24. The method of claim 22, wherein said providing said timing signals comprises providing each of said timing signals as a voltage pulse having a predetermined period during each timing cycle of the timing circuit, said timing cycle being substantially equal to $2^m$ of said predetermined periods.

25. The method of claim 24, wherein said providing said timing signals comprises providing said voltage pulses in accordance with a predetermined sequence.

26. The method of claim 22, wherein said generating said pulse width modulated signal includes phase shifting said pulse width modulated signal.

* * * * *